(12) United States Patent
Lee et al.

(10) Patent No.: US 8,892,973 B2
(45) Date of Patent: Nov. 18, 2014

(54) DEBUGGING CONTROL SYSTEM USING INSIDE CORE EVENT AS TRIGGER CONDITION AND METHOD OF THE SAME

(71) Applicant: National Cheng Kung University, Tainan (TW)

(72) Inventors: Kuen-Jong Lee, Tainan (TW); Jia-Wei Jhou, Tainan (TW)

(73) Assignee: National Cheng Kung University, Tainan (TW)

( * ) Notice: Subject to any disclaimer, the term of this patent is extended or adjusted under 35 U.S.C. 154(b) by 138 days.

(21) Appl. No.: 13/735,082

(22) Filed: Jan. 7, 2013

(65) Prior Publication Data

US 2014/0075255 A1   Mar. 13, 2014

(30) Foreign Application Priority Data

Sep. 11, 2012   (TW) ............................. 101133159 A

(51) Int. Cl.
```
G01R 31/28      (2006.01)
G06F 11/00      (2006.01)
G06F 1/00       (2006.01)
G01R 31/3177    (2006.01)
```
(52) U.S. Cl.
CPC ................................. *G01R 31/3177* (2013.01)
USPC .............. 714/727; 714/739; 714/30; 713/500

(58) Field of Classification Search
USPC ......... 714/724, 726, 727, 729, 733, 734, 744, 714/815, 799, 25, 30, 33, 34; 713/400, 500, 713/502
See application file for complete search history.

(56) References Cited

U.S. PATENT DOCUMENTS

| | | | |
|---|---|---|---|
| 5,515,382 A * | 5/1996 | Lassorie ....................... 714/730 |
| 7,454,678 B2 * | 11/2008 | Cullen et al. .................. 714/729 |
| 8,402,329 B2 * | 3/2013 | Niiyama et al. .............. 714/726 |
| 2014/0115374 A1 * | 4/2014 | Iyer et al. ...................... 713/400 |

* cited by examiner

*Primary Examiner* — Christine Tu
(74) *Attorney, Agent, or Firm* — Rosenberg, Klein & Lee

(57) ABSTRACT

A debugging control system using inside-core events as trigger conditions and a method of the same are revealed. The method includes following steps. First set up at least one trigger condition and a search range of the clock cycle according to internal states of a core under debug. Pause clock and recover clock of each clock cycle within the search range. Retrieve data of scan chains of the core under debug by a shift buffer during the clock pausing. Next combine data of the scan chains by a trigger comparator circuit to form trigger signals and check whether the trigger signals satisfy the trigger condition. If the trigger condition is satisfied or the trigger signal is over the search range, the clock is paused continuingly and internal states of the scan chains of the core under debug are output otherwise the core under debug is recovered.

24 Claims, 11 Drawing Sheets

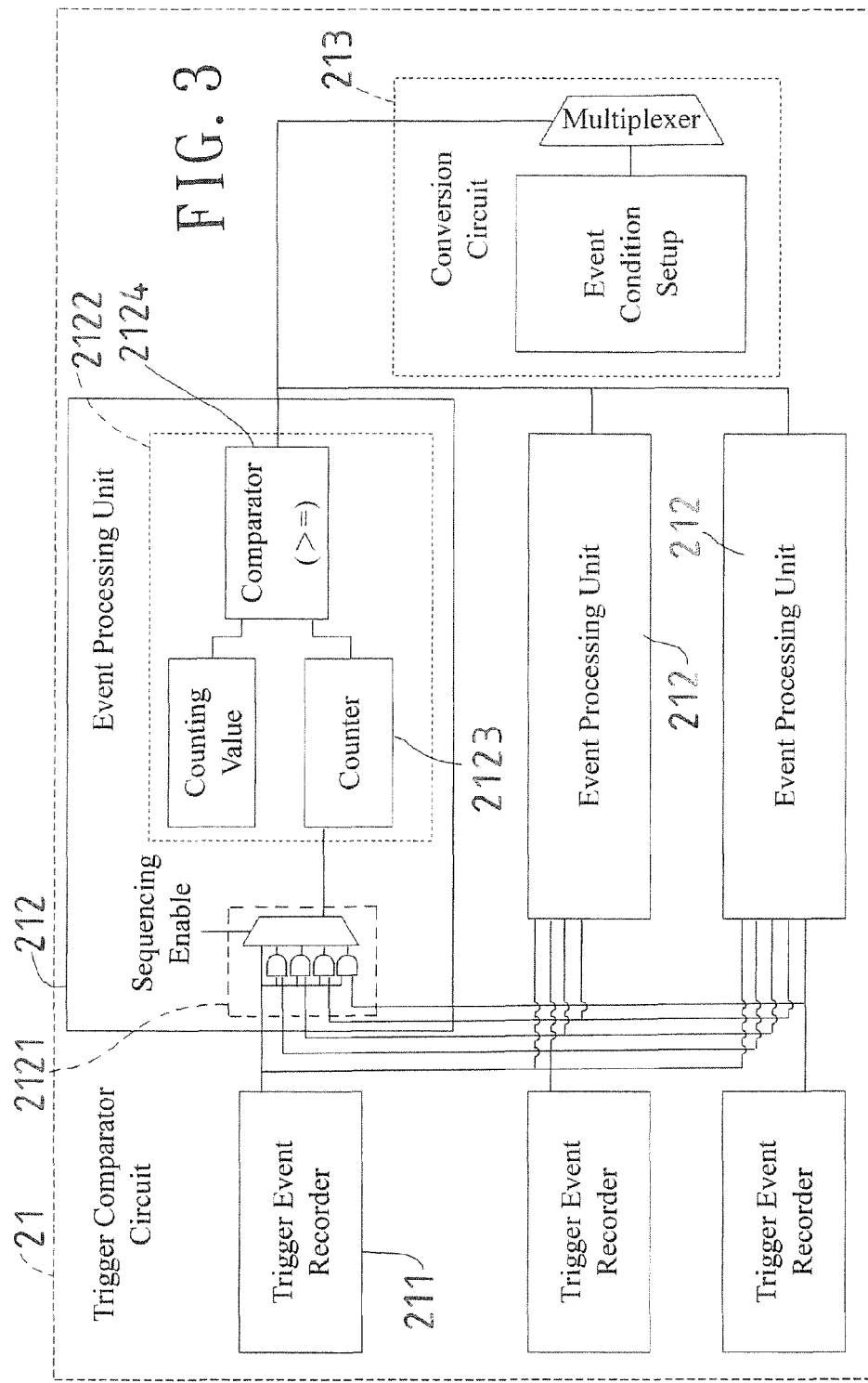

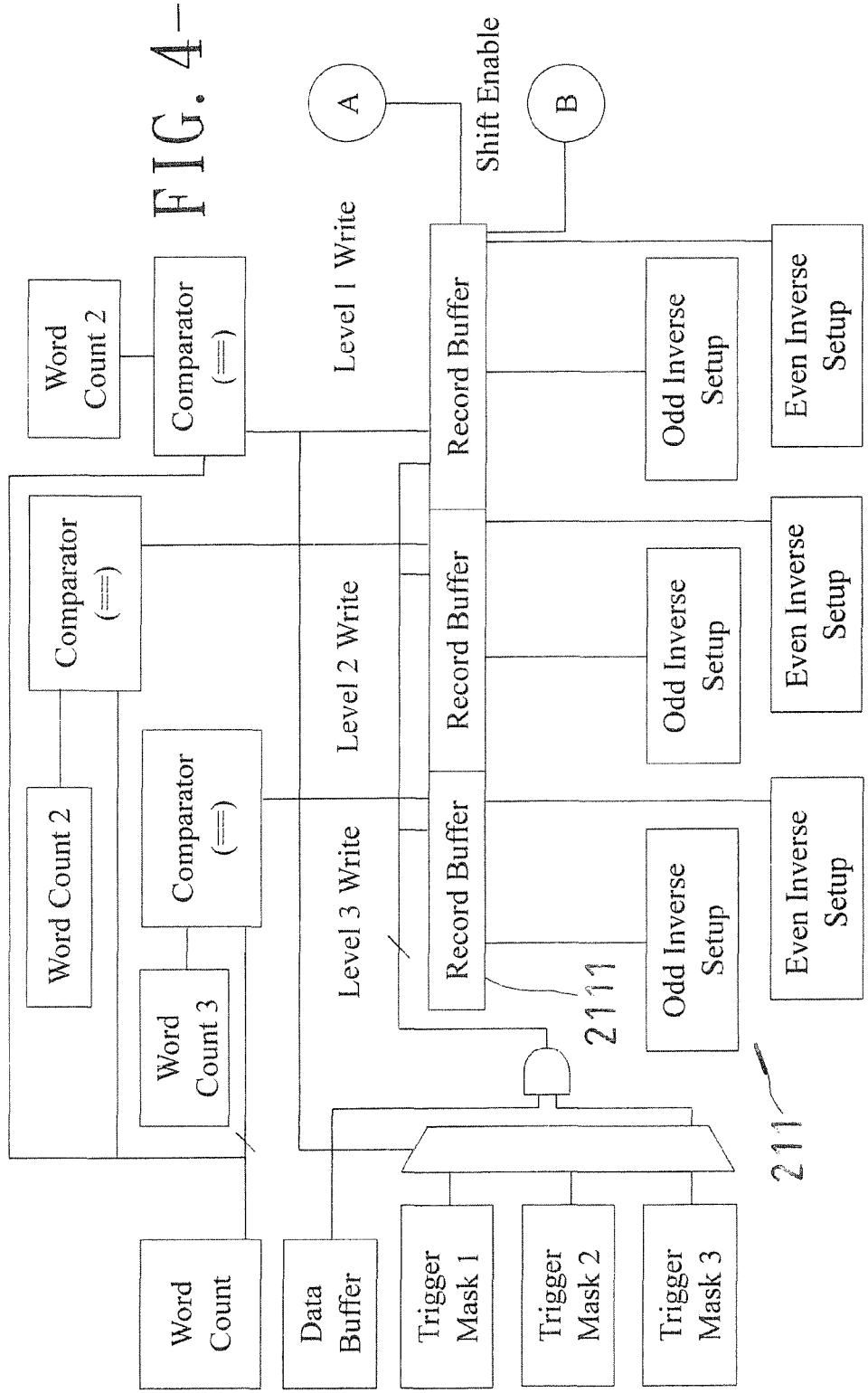
FIG. 4-A

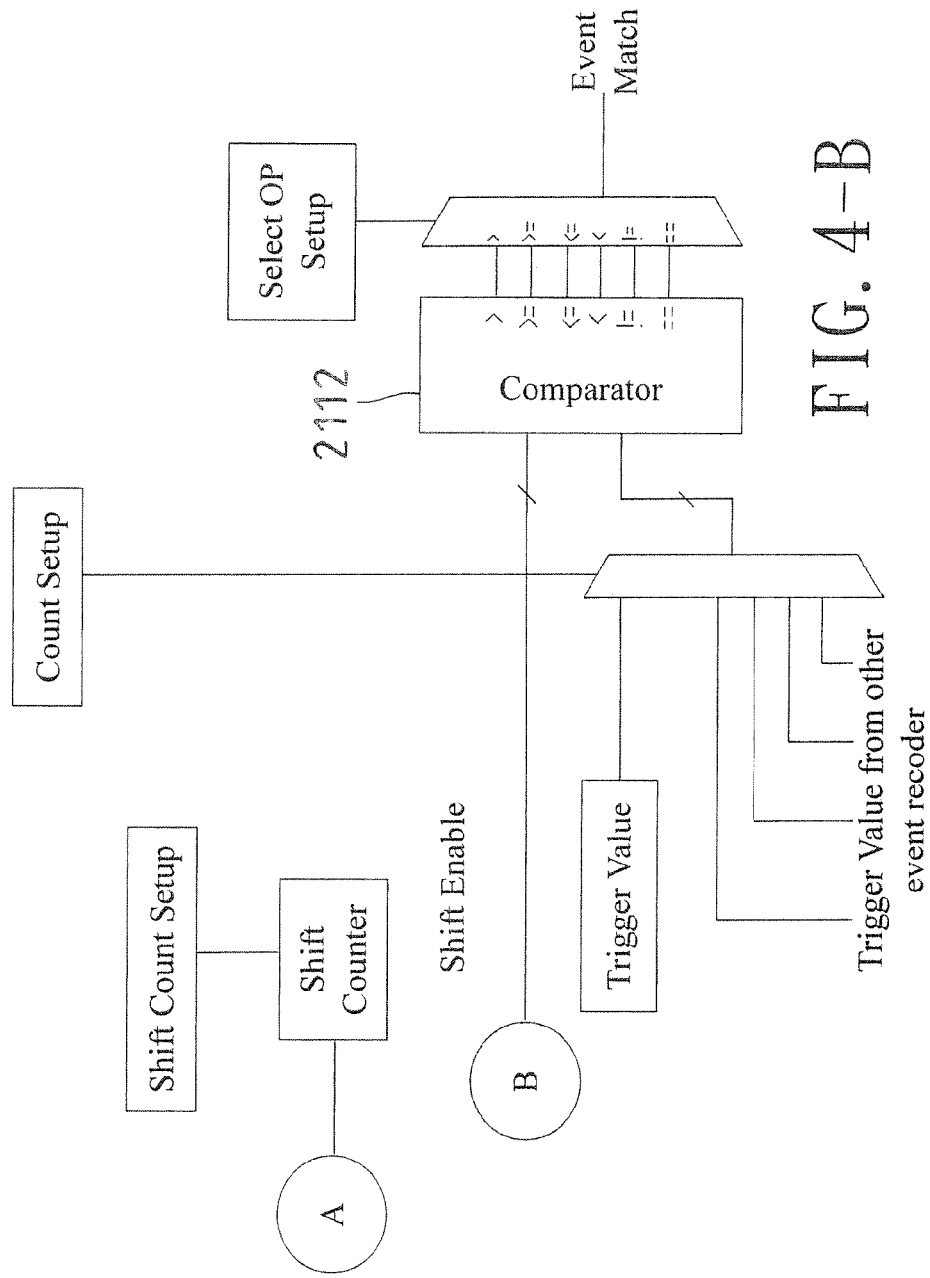
FIG. 4-B

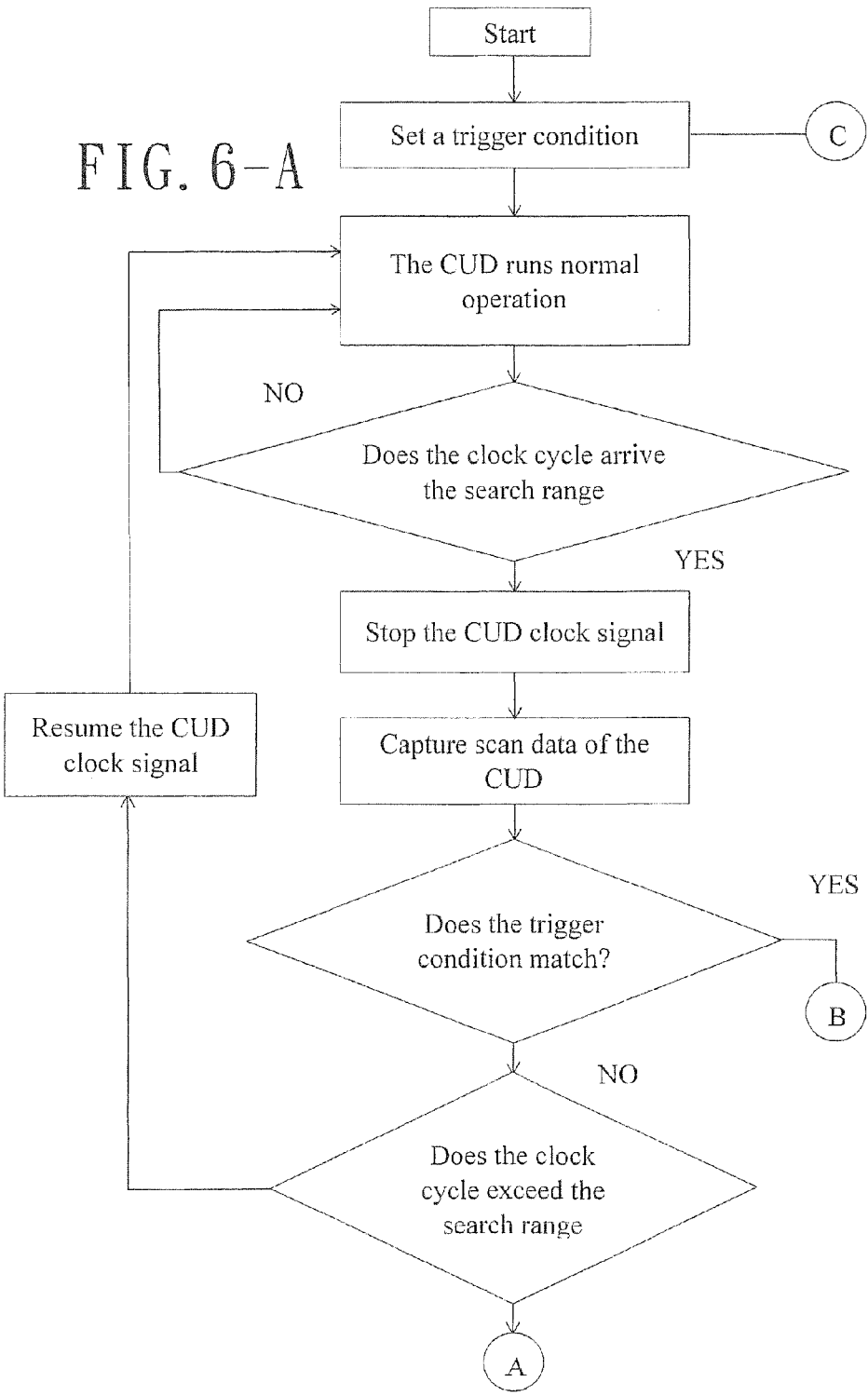
FIG. 6-A

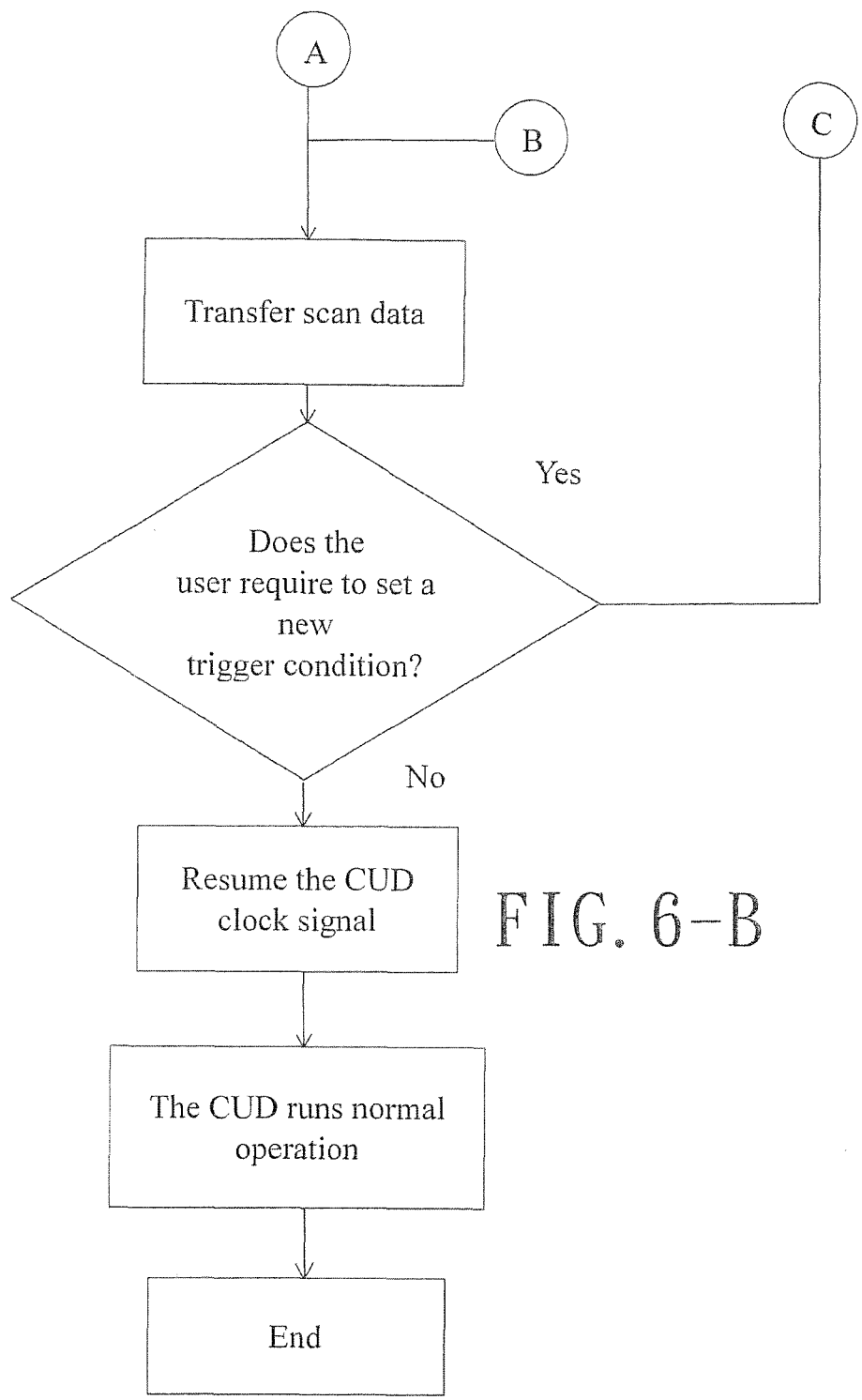
FIG. 6-B

DEBUGGING CONTROL SYSTEM USING INSIDE CORE EVENT AS TRIGGER CONDITION AND METHOD OF THE SAME

BACKGROUND OF THE INVENTION

1. Fields of the invention

The present invention relates to a debugging control system that uses inside-core events as trigger conditions and a method of the same, especially to a debugging control system that uses inside-core events as trigger conditions and a method of the same that adds cores designed for debugging into intellectual property (IP) during the design of integrated circuit for debugging of the IP after finishing production of the integrated circuit or the cores being written with programmable logic arrays. Moreover, values in registers of the core under debug are changed by a graphical interface software module so that the core under debug can be resumed to execute original programs according to the current internal state when the core under debug returns from a paused state to a normal state. The debugging time for the integrated circuit is dramatically reduced.

2. Descriptions of Related Art

Generally, a conventional debugging way triggered by events is built based on a debug and trace architecture. A plurality of watchpoints is inserted into a core and a debug and trace hardware gets signals of the watchpoints in the core and records the signals of the watchpoints for users to debug. In the debug and trace architecture, occurrences of the trigger events are detected by a fixed comparator and a finite-state machine with pre-defined signals. Although the occurrences of the trigger events can be detected correctly, the trigger events are unable to be modified due to the fixed signals and the comparator. It's quite hard to find out bugs in practice.

Moreover, the fixed comparator used has limits on the trigger events and this leads to insufficient comparison mode for the trigger event. In some research, event comparators are revealed to solve the problem of the comparison mode. However, not all signals in a core under debug (such as intellectual property (IP)) have the capability to reorganize the trigger events. The trigger signals are predetermined before manufacturing of the core under debug. Or the core under debug can be reconfigured by a plurality of multiplexers after being produced to get trigger signals. Thus the signals are difficult to be modified and used as trigger events and most of tracing and debugging is unable to record all signals inside the core. The debug and trace signals are only defined according to signals set in the debug core and memory size. Thus the data resolution obtained is not sufficient for users to find out where errors occurred.

After finishing production of the integrated circuit, the debug and trace method available now lacks observability and controllability of the signals in the IP. Thus circuit errors can only be observed through output/input ports of the integrated circuit during verification of the IP and there is no way to observe internal states of the core directly. Therefore it's difficult to find out and remove bugs of the integrated circuit. In order to reduce difficulties in verification of the core, designers add some cores designed for debug inside the integrated circuit so as to perform debugging efficiently. Refer to Taiwanese Pat. No. 1310461 "DEBUGGING SYSTEM AND SCAN-BASED DEBUGGING METHOD OF INTEGRATED CIRCUIT", a scan-based debugging system and a method thereof are revealed. A scan-based integrated circuit includes a test interface, an in-circuit emulator, a core under debug and a memory. The in-circuit emulator is used to debug software of the system through the test interface. The core under debug has scan chain for reading out the state of every flip-flop. The state read out by the scan chain is saved in the memory and is transmitted to a computer through the test interface. The debugging method includes a plurality of steps. First stop operations of an integrated circuit in a normal mode. The states of a plurality of nodes of the core under debug are read out from a scan chain and saved in a memory. The states of the nodes are transmitted to a computer through a test interface. The integrated circuit further includes a scan-based debugging device coupled to the core under debug and the memory. The scan-based debugging device has a scan-based debugging controller. When the scan-based debugging controller is initialized, it checks whether the existing error condition is satisfied. The error conditions are written into the scan-based debugging controller. Once the existing condition is satisfied, the scan-based debugging controller stops the core under debug and enters a scan mode. However, the system and the method mentioned above has following disadvantages: (a) User are unable to select signals of the scan chains of the IP freely and use them as trigger signals and set trigger events. Thus they need to spend more time to find out bugs in the IP. (b) When the user is in a debug mode and is intended to go back to a normal mode, the core under debug is unable to turn back to the state before being paused. Thus the verification of the core under debug starts after system reset. The debugging time is increased. Thus there is room for improvement.

SUMMARY OF THE INVENTION

Therefore it is primary object of the present invention to provide cores designed for debugging and added into an intellectual property (IP) during the design of the integrated circuit. After finishing production of the integrated circuit or being written with programmable logic arrays, these cores form a debugging system that performs debugging process in the IP. A debugging control method is also revealed. Moreover, values in registers of a core under debug can be modified by a graphical interface software module. Thus the core under debug can be resumed to execute its original programs according to current internal states while turning from a paused state to a normal state. Therefore the debugging time of the integrated circuit is significantly reduced.

In order to achieve the above object, a debugging control system that uses inside-core events as trigger conditions of the present invention is applied to a core under debug. The debugging control system includes a clock controller and a debug control module. Within a specified search range of clock cycles, the clock controller outputs pause clock and recovery clock to the core under debug for control of the core under debug in a debug mode and a normal mode respectively. The debug control module is composed of a trigger comparator circuit and at least one shift buffer. Data in the core under debug is temporarily saved in the shift buffer in the debug mode while the trigger comparator circuit detects whether an internal state of the core under debug satisfies the trigger condition. The search range of the clock cycles is a part of the clock cycles while the core under debug performing processing. The trigger condition is a single trigger event or a plurality of trigger events combined according to the logical relations, the sequencing order and the number of occurrences of these events. A trigger event is a comparison result of a trigger signal with a trigger value or another trigger signal by a comparison operator. Each trigger signal can be selected from one of the registers of the scan chain of the core under debug.

In the above debugging control system that uses inside-core events as trigger condition, the core under debug transmits the data to the shift buffer via at least one scan chain. The core under debug furnishes the capability of wrapping a core with the boundary scan standard such as IEEE 1149.1 or IEEE 1500 for control of the core under debug.

In the debugging control system that uses inside-core events as trigger condition mentioned above, a graphical interface software module is used to set up the trigger condition and the search range of the clock cycles. Then setting signals are transmitted to the debugging control system by a transmission interface such as a joint test action group (JTAG) interface, an universal asynchronous receiver/transmitter (UART) interface, a peripheral component interconnect (PCI) interface or an universal serial bus (USB) interface.

In the above debugging control system that uses inside-core events as trigger condition, the shift buffer includes a scan buffer, a load buffer, and a data counter. In a debug mode, data in the core under debug is temporarily saved in the scan buffer while the data saved in the scan buffer is replicated by the load buffer in a parallel way. The data counter is used to count data in the scan buffer. When the above data is moved to the trigger comparator circuit, the data in the scan buffer is also turned back to original position in the core under debug. Thus the core under debug can be resumed to execute original programs according to current internal states when the paused state of the core under debug is released.

In the above debugging control system that uses inside-core events as trigger condition, the trigger comparator circuit consists of at least one trigger event recorder, at least one event processing unit, and at least one conversion circuit (such as a look-up table conversion circuit). The trigger event recorder combines data of the shift buffer to form trigger signals, compares the trigger signals with the user-specified trigger values or other trigger signals to learn whether they are matched or not, and transmits the comparison result to the event processing unit for detecting whether the sequencing order and the number of occurrences of the trigger events satisfy the trigger condition. Then the event processing unit delivers a detection result to the conversion circuit for checking whether logical relations of the trigger events satisfy the trigger condition.

In the above debugging control system that uses inside-core events as trigger condition, the event processing unit includes a trigger sequencer, and a trigger event counter. The trigger sequencer formed by a multiplexer and an AND gate is for detecting the sequencing order of the trigger events while the trigger event counter composed of a counter and a comparator is used to detect the number of occurrences of each trigger event.

In the above debugging control system that uses inside-core events as trigger condition, the trigger event recorder includes at least one record buffer that records trigger signals and a comparator that checks whether the trigger signal matches the trigger event. The comparator compares the trigger signal with a trigger value or another trigger signal to get the relation therebetween and outputs the comparison result, where a trigger value can be an unsigned number, a signed number, a floating point number or another trigger signal. The relation between the trigger signal and the number/or another trigger signal can be equal to, not equal to, greater, no less, smaller or no more than each other.

Moreover, a method of a debugging control system that uses inside-core events as trigger condition is also provided by the present invention. The method includes a plurality of steps. In the beginning, set up at least one trigger condition that contains a single trigger event or a plurality of trigger events combined according to the required logical relations, the sequencing order and the number of occurrences of these events, and specify a search range of the clock cycles according to internal states of a core under debug. Later pause clock and recover clock within each clock cycle of the search range. Retrieve data of scan chains of the core under debug by a shift buffer during clock pausing. Next combine data of the scan chains by a trigger comparator circuit to form a trigger signal and check whether the trigger signal satisfies a corresponding trigger event. Repeat this for each trigger event if a plurality of trigger events is set up. Then check whether the combination of all the trigger events satisfies the trigger condition. If the trigger condition is satisfied or the trigger signal is over the search range, the clock is paused continuingly and internal states of the scan chains of the core under debug are output. Otherwise the core under debug is recovered. The debug control module uses a finite-state machine (FSM) to control the debug flow and generates test mode select (TMS) signals for control of the core under debug.

Thereby all flip-flops in the core under debug can be used as targets of the trigger events and signals of the scan chains of the IP can be selected freely and used as trigger signals to set trigger events. The logical relations, the sequencing order and the number of occurrences of each trigger event can be combined freely and used as a trigger condition. A high degree of freedom is provided and the debugging efficiency of the integrated circuit is significantly increased. Moreover, values in the register of the core under debug are changed by the graphical interface software module so that the core under debug is adjusted to the state the user expected while the core under debug returning from the paused state to the normal state. Then the paused state of the core under debug is released and the core under debug is resumed to execute original programs according to the current internal state. And there is no need to start verification from the beginning repeatedly. Thus not only the debugging time for the integrated circuit is reduced, observability and controllability of the core are also increased so as to improve debugging performance of the core under debug. Therefore bugs in the core are quickly found out by the present invention and the difficulty in debugging of the integrated circuit is reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 3 is a block diagram showing internal configuration of a trigger comparator circuit of an embodiment of a debugging control system according to the present invention;

FIG. 4A and FIG. 4B are block diagrams showing electrical connections of a trigger event recorder of an embodiment of a debugging control system according to the present invention;

FIG. 6A is a block diagram showing a part of flow chart of debugging in a core under debug by a debugging control system according to the present invention;

FIG. 6B is a block diagram showing another part of flow chart of debugging in a core under debug by a debugging control system according to the present invention;

DETAILED DESCRIPTION OF THE PREFERRED EMBODIMENT

Figure 1:
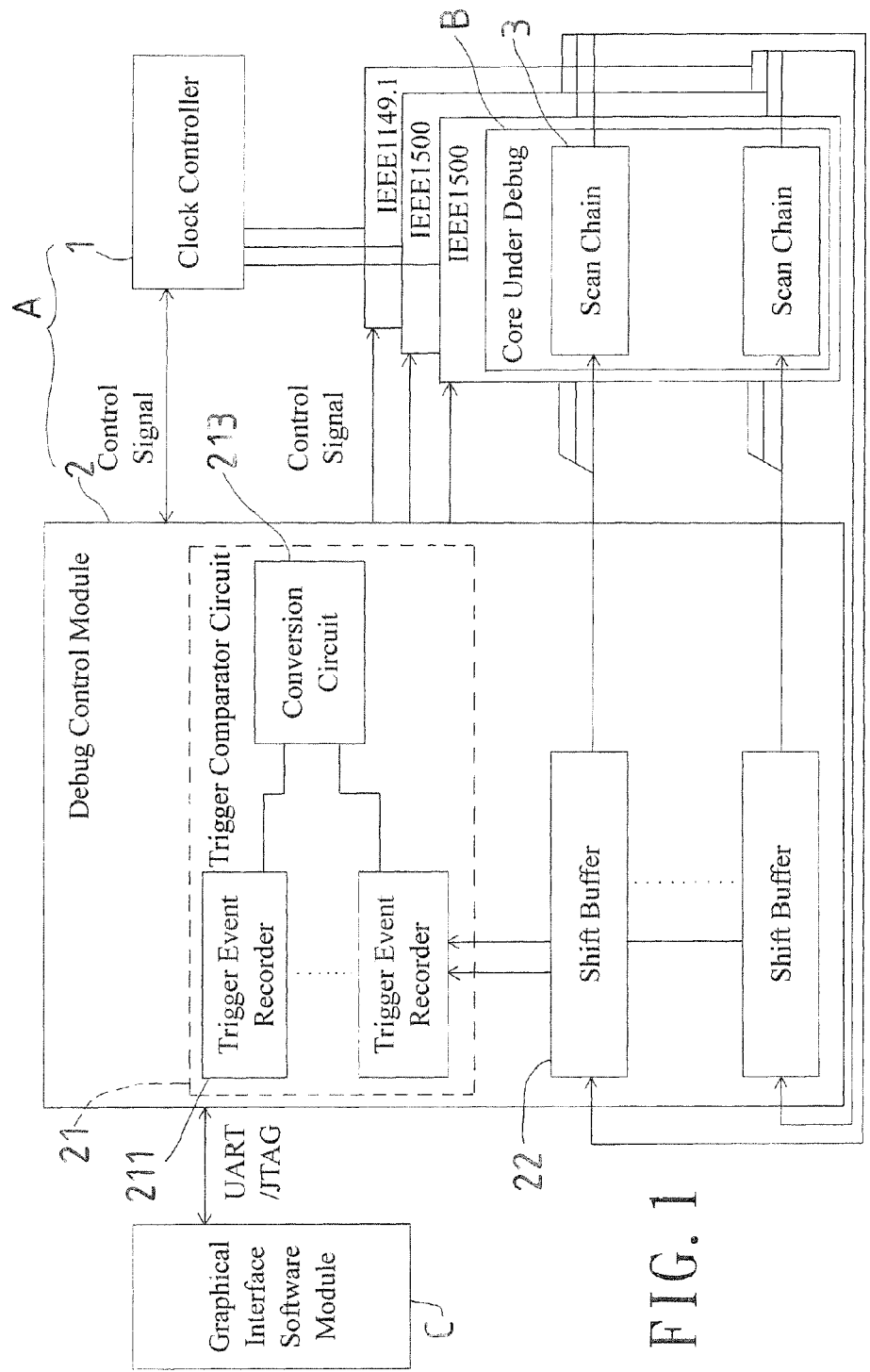
FIG. 1 is a block diagram showing electrical connections of an embodiment of a debugging control system applied to a core under debug and a graphical interface software module by which users input setting according to the present invention.

Refer to FIG. 1, an embodiment of a debugging control system (A) of the present invention is applied to a core under debug (B) and a graphical interface software module (C) is for users to input a block diagram showing electrical connections being set. The debugging control system (A) that uses inside-core events as trigger conditions according to the present invention includes a clock controller 1 and a debug control module 2.

The clock controller 1 outputs pause clock and recovery clock to the core under debug (B) within a specified search range of clock cycle for control of the core under debug (B) in a debug mode and a normal mode respectively. The debug control module 2 consists of a trigger comparator circuit 21 and at least one shift buffer 22. In the debug mode, data in the core under debug (B) is transmitted to the shift buffer 22 via a pathway of at least one scan chain (3) and is temporarily saved in the shift buffer 22. Then the data is used by the trigger comparator circuit 21 to detect whether an internal state of the core under debug (B) satisfies the trigger condition. The core under debug (B) furnishes the capability of wrapping a core with the IEEE 1149.1 or IEEE 1500 boundary scan standard. In this embodiment, an IEEE 1500 wrapper is used to scan internal signals for control of the core under debug (B) while performing debugging. The wrapper further includes a plurality of inverter cells, a plurality of balance scan cells, a boundary scan, a wrapper instruction register, a wrapper controller, and a wrapper clock controller. The inverter cell enables each scan chain 3 of the core under debug (B) to have an even number of inverted outputs while the balance scan cell makes each scan chain 3 of the core under debug (B) have the same length. While the core under debug (B) is debugged, signals of each balance scan cell on the scan chain 3 is back to the original state after being rotated to original positions. The boundary scan is used to record signals of input and output ports of the core under debug (B). The wrapper instruction register is for recording instructions the wrapper executes. The wrapper controller analyzes control signals in instruction registers and in the wrapper and generates corresponding control signals. As to the wrapper clock controller, it controls the clock of the core under debug (B) and further controls the scan chains 3 of the core under debug (B). The principle and architecture of the wrapper mentioned above is well known for those skilled in the art. The wrapper of the present invention is not limited to the IEEE 1149.1 or IEEE 1500 standard as long as it can scan signals inside the core under debug (B).

Moreover, the search range of the clock cycles is a part of the clock cycles while the core under debug (B) performing processing. The trigger condition can be a single trigger event or a combination of a plurality of trigger events combined according to their logical relations, the sequencing order and the number of occurrences. The trigger event is a comparison result of a trigger signal with trigger counts by a comparison operator. The trigger signal is selected from one of the registers of the scan chain 3 of the core under debug (B). Furthermore, the trigger condition and the search range of the clock cycle are set by means of a graphical interface software module (C) and are transmitted to the debugging control system (A) by a transmission interface. The transmission interface can be, but not limited to, a joint test action group (JTAG) interface, an universal asynchronous receiver/transmitter (UART) interface, a peripheral component interconnect (PCI) interface or an universal serial bus (USB) interface.

Figure 2:
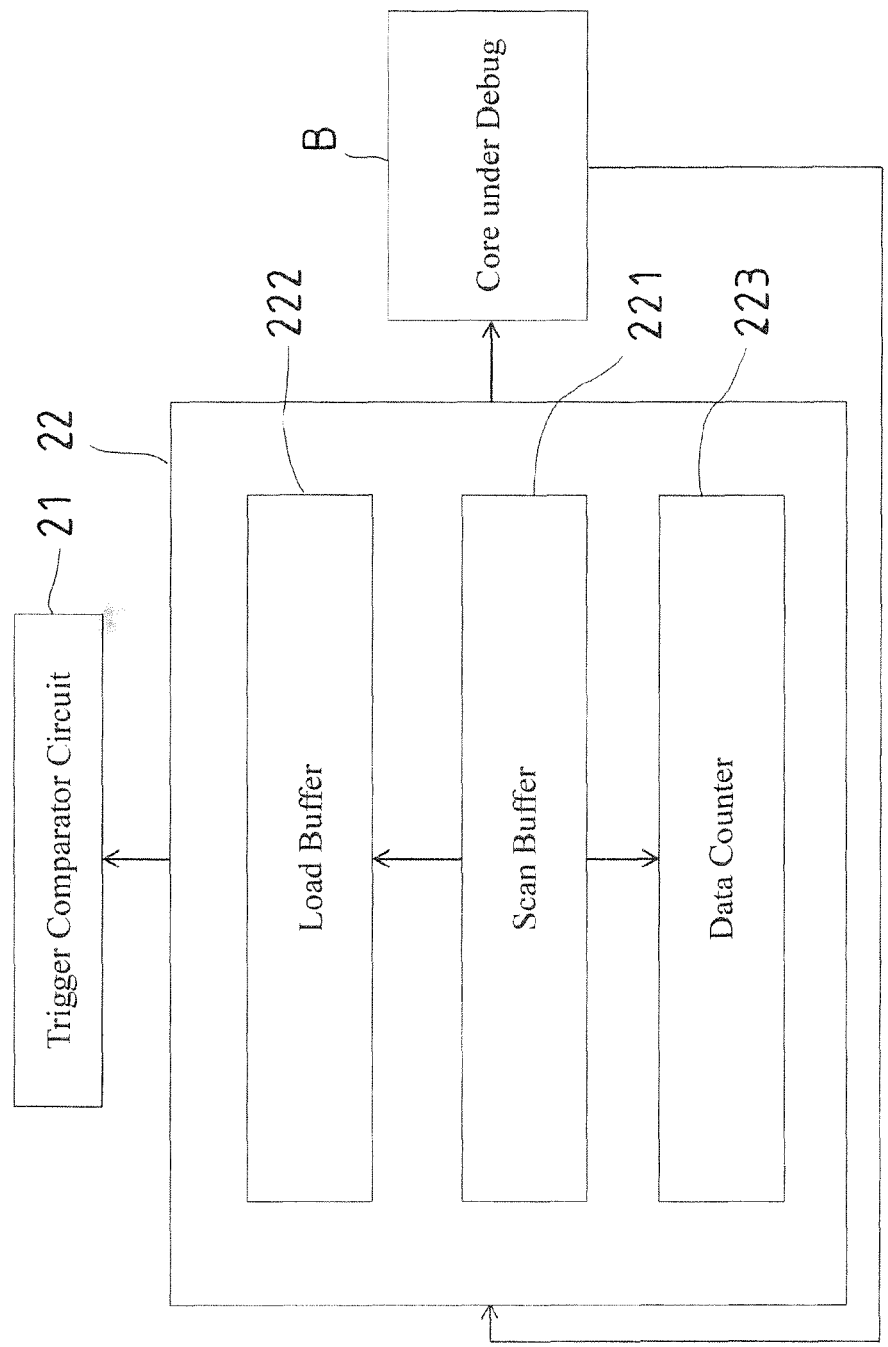
FIG. 2 is a block diagram showing internal configuration of a shift buffer of an embodiment of a debugging control system according to the present invention.

Refer to FIG. 2, a block diagram showing circuit configuration inside a shift buffer of an embodiment of a debugging control system according to the present invention is revealed. A shift buffer 22 consists of a scan buffer 221, a load buffer 222, and a data counter 223. In a debug mode, data in the core under debug (B) is temporarily saved in the scan buffer 221 while the data in the scan buffer 221 is replicated by the load buffer 222 in a parallel way. As to the data counter 223, it is used to count data in the scan buffer 221. When the above data is moved to the trigger comparator circuit 21, the data in the scan buffer 221 is also turned back to original position in the core under debug (B). Thus the core under debug (B) executes original programs according to current internal states when the paused state of the core under debug (B) is released.

Refer to FIG. 3, a block diagram showing internal configuration of a trigger comparator circuit of a debugging control system according to the present invention is revealed. The trigger comparator circuit 21 is composed of at least one trigger event recorder 211, at least one event processing unit 212, and a conversion circuit 213. The conversion circuit 213 can be a look-up table conversion circuit. The trigger event recorder 211 combines data of the shift buffer 22 to form trigger signals used to compare with the trigger event. Also refer to FIG. 1, the trigger event recorder 211 also compares the trigger signal with the trigger event to learn whether they are matched or not and transmits the comparison result to the event processing unit 212 for detecting whether the sequencing order and the number of occurrences of the trigger event satisfy the trigger condition. Then the event processing unit 212 sends a detection result to the conversion circuit 213 for checking whether logical relations of the trigger event satisfy the trigger condition. The event processing unit 212 includes a trigger sequencer 2121, and a trigger event counter 2122. The trigger sequencer 2121 including a multiplexer and an AND gate is for detecting the sequencing order of the trigger event while the trigger event counter 2122 composed of a counter 2123 and a comparator 2124 is used for detecting the number of occurrences of the trigger event. Refer to FIG. 4A and FIG. 4B, a block diagram showing electrical connection and circuit configuration inside a trigger event recorder 211. The trigger event recorder 211 includes at least one record buffer 2111 for recording trigger signals and a comparator 2112 for checking whether the trigger signals match the trigger event. The comparator 2112 compares the trigger signal with a trigger value or another trigger signal to get the relation therebetween and output the comparison result. The trigger value can be an unsigned number, a signed number or a floating point number. The relation between the trigger signal and the trigger value/or another trigger signal can be equal to, not equal to, greater, no less, smaller or no more than each other.

Figure 5:
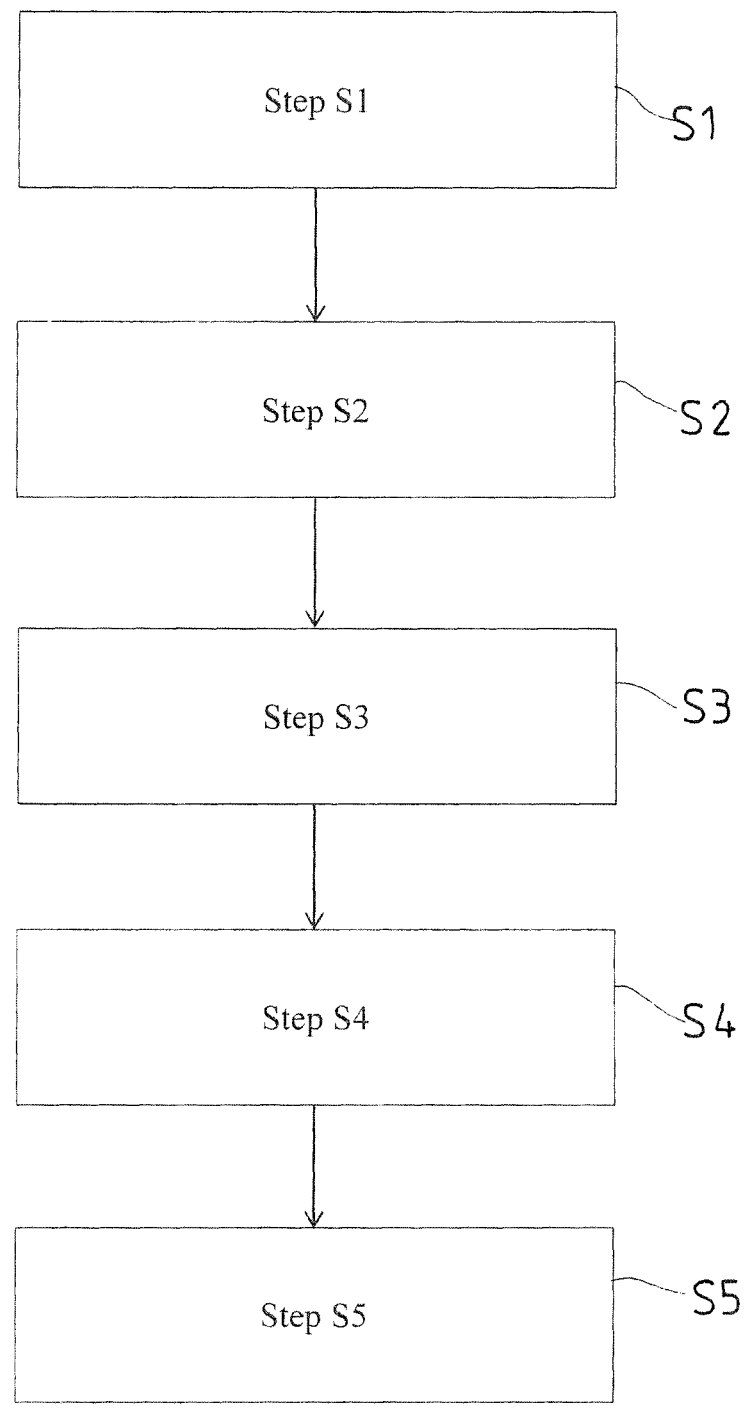
FIG. 5 is a flow chart showing steps of a debugging control method that uses inside-core events as trigger conditions according to the present invention.

A debugging control method that uses inside-core events as trigger conditions of the present invention is not only suitable for the debugging control system (A) but also applied to a core under debug (B). Refer to FIG. 5 a flow chart showing steps of a debugging control method that uses inside-core events as trigger condition of the present invention is revealed. The debugging control method that uses inside-core events as trigger condition includes following steps:

Step S1: Setting up at least one trigger condition and a search range of the clock cycle according to internal states of a core under debug (B). The trigger condition is a single trigger event or combinations of a plurality of trigger events combined according to their logical relations, the sequencing order and the number of occurrences. A trigger event is a comparison result of a trigger signal with a trigger value by a comparison operator. Each trigger signal is selected from one of the registers of the scan chain 3 of the core under debug (B) while the search range of the clock cycles is a part (period) of the clock cycles when the core under debug (B) performs processing.

Step S2: Pausing clock and recovering clock within each clock cycle of the search range. In this embodiment, the clock controller 1 mentioned above is used to execute clock pause and clock recovery within the search range of the clock cycle.

Step S3: Retrieving data of scan chains of the core under debug (B) by the shift buffer 22 during the clock pausing. In the debug mode, the scan buffer 221 is used to save data in the core under debug (B) and the load buffer 222 replicates data in the scan buffer 221 in a parallel way. Then the data counter 223 counts data in the scan buffer 221. The data in the scan buffer 221 can also be moved back to original positions in the core under debug (B) so that the core under debug (B) can execute original programs after turning back to the normal mode.

Step S4: Combining data of the scan chains again by the trigger comparator circuit 21 to form at least one trigger signal and checking whether the trigger signal satisfies the trigger condition, repeating this for all set trigger events, and then checking whether the combination of these events satisfied the trigger condition according to their logical relations, sequencing order and numbers of occurrences; and Step S5: Pausing clock continuingly and outputting internal states of the scan chains of the core under debug (B) if the trigger condition is satisfied or the trigger signal is over the search range of the clock cycle, otherwise recovering operations of the core under debug (B) if the trigger signal doesn't satisfy the trigger condition.

While in use, the debug control module 2 controls debug flows by a finite-state machine (FSM), and generates test mode select (TMS) signals to control the core under debug (B). Refer to FIG. 6A and FIG. 6B, flow charts of block diagrams showing execution of debugging by a debug control system of the present invention. Before manufacturing integrated circuit, first a core under debug (B) is built with scan chains and an IEEE 1500 wrapper is wrapped. Then the core under debug (B) is connected to a debugging control system (A) to be integrated into the integrated circuit. Thus an intellectual property of the integrated circuit is debugged by a debugging method that uses inside-core events as trigger signals while verifying IP after finishing production of the integrated circuit or the cores being written with programmable logic arrays. Also refer from FIG. 1 to FIG. 3, after the integrated circuit starting operation, a trigger condition and a search range are set up by a graphical interface software module (C) so as to initialize the debug control system according to the settings. In a debug mode, the debugging control system (A) performs debugging process in the core under debug (B). Then when the core under debug (B) operates to the specified search range, the debugging control system (A) informs the clock controller 1 to control clock enable signals for pausing the clock of the core under debug (B) temporarily and switching to a debug clock. Thus the debugging control system (A) starts to control the core under debug (B) and moves data of the scan chains 3 of the core under debug (B) to the shift buffer 22 of the debugging control system (A). Then the data is written into the memory. As to the trigger comparator circuit 21, it now checks whether the data in the shift buffer 22 is required for checking whether the event occurs. If the data is required, the data in the shift buffer 22 is temporarily saved into the trigger event recorder 211 of the trigger comparator circuit 21. At the same time, the data in the shift buffer 22 is refilled into the scan chains 3 of the core under debug (B) so that the core under debug (B) is recovered to execute original programs after turning back to the normal mode.

Moreover, in the debug mode, all data required is temporarily saved in the trigger event recorder 211 and is combined again to form trigger signals according to the settings. Then the trigger signals and the trigger counts/or the two trigger signals are compared by the comparator 2112. According to the comparison result, the trigger sequencer 2121 checks the sequencing order of the events and the trigger event counter 2122 counts the number of occurrences of each event. Finally the conversion circuit 213 determines whether the logical relation of each trigger event satisfies the trigger condition. If the trigger condition is not satisfied, the clock signal of the core under debug (B) is recovered. After a clock cycle of the core under debug (B) operating normally, repeat the above steps until the trigger condition is satisfied or the operated clock cycle is over the search range. On the other hand, when the trigger comparator circuit 21 detects that the internal state of the core under debug (B) satisfies the trigger condition or the operated clock cycle is over the search range, the debugging control system (A) transmits the state of the core under debug (B) saved in the memory into the graphical interface software (C), and also informs the user that the trigger condition has been detected or the operated clock cycle has already been over the search range. The paused state continues until the debugging control system (A) is set again.

Figure 7:
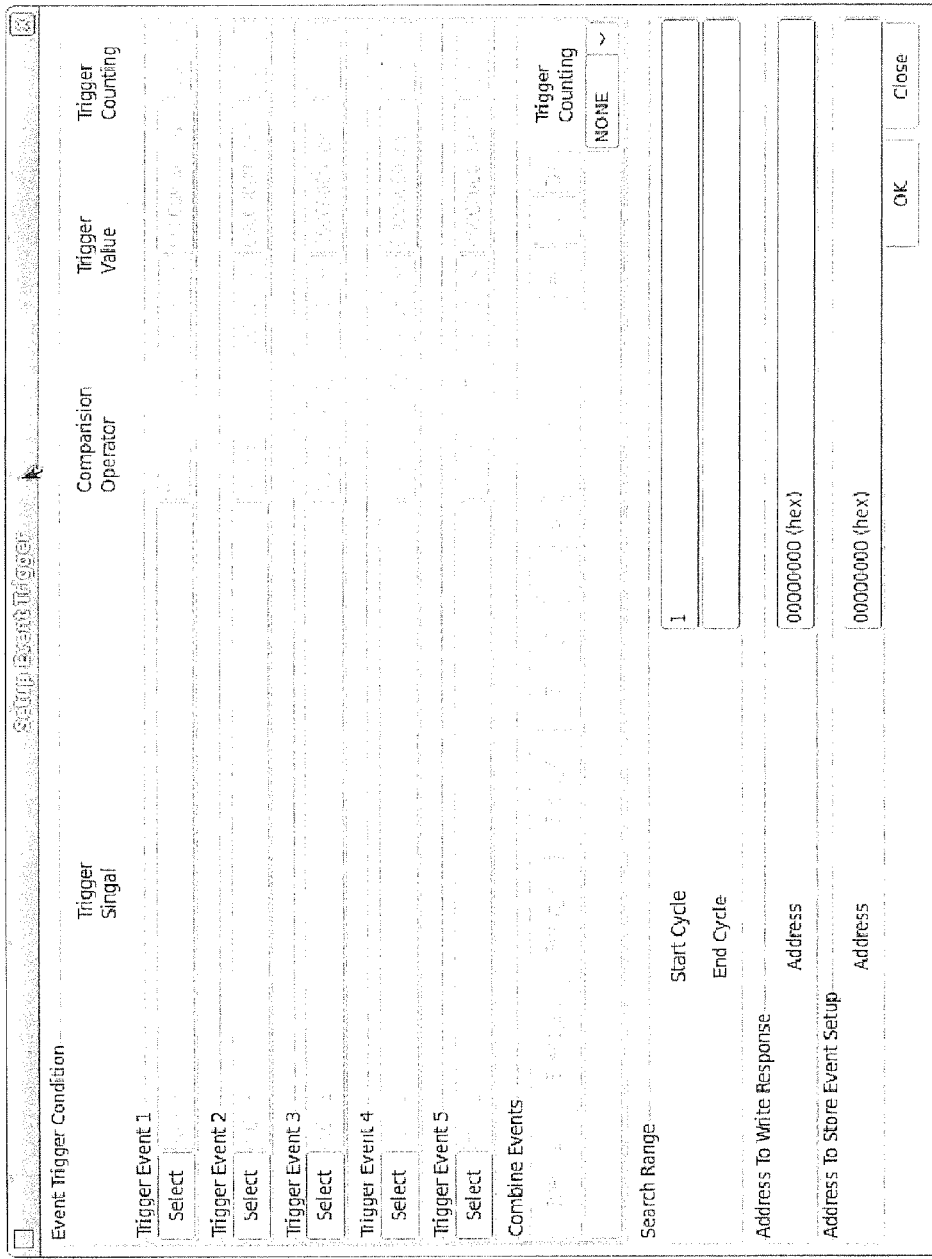
FIG. 7 is a schematic drawing showing an interface of a graphical interface software module of a debugging control system used to set up trigger conditions according to the present invention.
Figure 8:
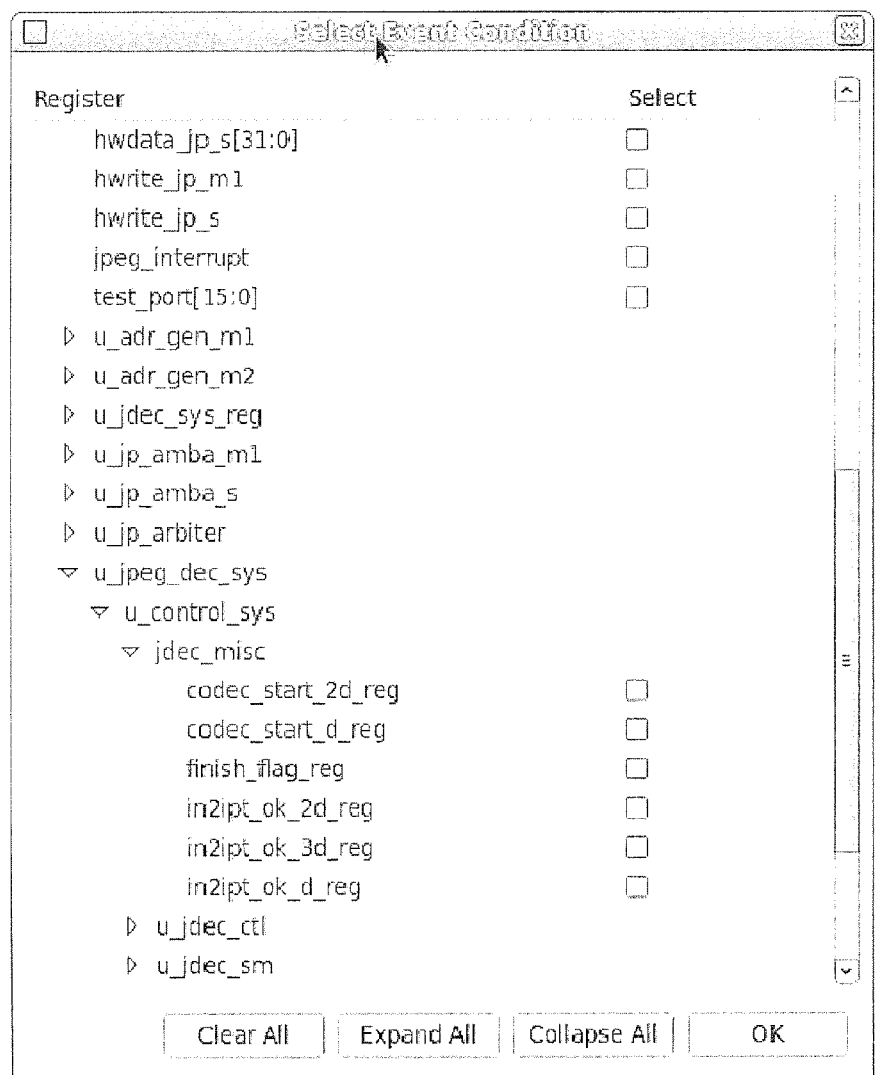
FIG. 8 is a schematic drawing showing an interface of a graphical interface software module of a debugging control system used to select trigger signals according to the present invention.
Figure 9:
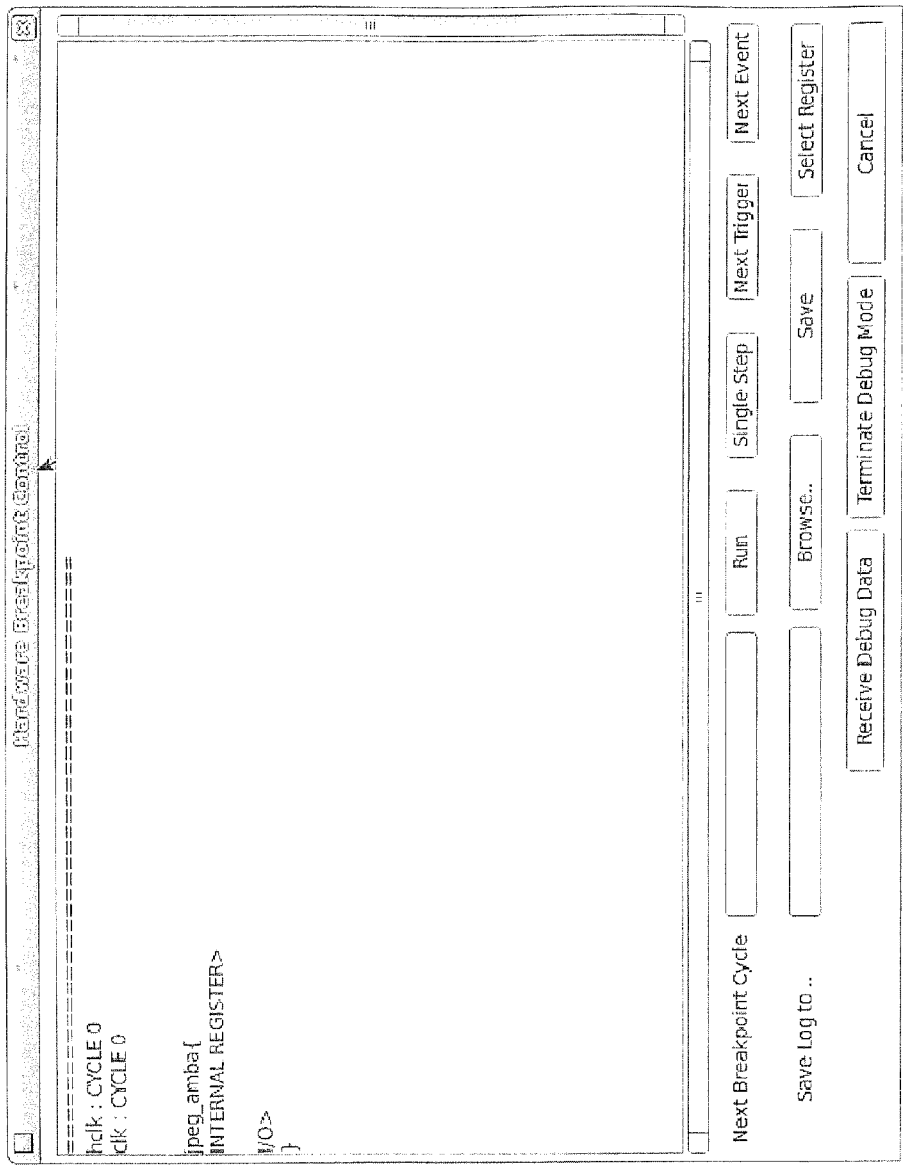
FIG. 9 is a schematic drawing showing an interface of a graphical interface software module of a debugging control system of a debugging control system used to control debugging flowchart according to the present invention.

It should be noted that the graphical interface software (C) of the present invention can control the debugging control system (A) to enable repeat trigger under the same trigger condition, set a new trigger condition, directly jump to the designated clock cycle or not trigger any event. The graphical interface software module (C) can also convert the data received into a waveform file so that the users can analyze internal state of the core conveniently. Refer to FIG. 7 to FIG. 9, schematic drawings respectively showing an interface of a graphical interface software module of a debugging control system used to set up trigger conditions, select trigger signals and control debugging flowchart are revealed. Finally, if the user wants to finish the verification of the core under debug (B), the clock of the core under debug (B) is recovered by the debugging control system (A) and then the core under debug (B) executes original programs.

In summary, the present invention has following advantages compared with techniques available now:

1. In the present invention, all flip-flops in the core under debug can be used as targets of the trigger events. Signals of the scan chains of the IP can be selected freely and used as trigger signals to set trigger events. The logical relations, the sequencing order and the number of occurrences of each trigger event can be combined freely and used as trigger conditions. Thus a high degree of freedom is provided and the debugging efficiency of the integrated circuit is dramatically improved.

2. The debugging process of the present invention will not interfere with internal states of the core and the system can enter the debug mode repeatedly and return to the normal mode. There is no need to start from the beginning of the verification. Thus not only the debugging time for the integrated circuit is reduced, observability and controllability of the core are also increased so as to improve debugging performance of the core under debug. The bugs in the core are quickly found out by the present invention and the difficulty in debugging of the integrated circuit is reduced.

3. The debugging control system of the present invention changes values in the register of the core under debug by the graphical interface software module. Thus the core under debug is adjusted to the state the user expected while turning from the paused state to the normal state. Then the paused state of the core under debug is released and the core under debug executes original programs according to the current internal state. Therefore the verification of the core under debug is not necessary to start from the system reset and the debugging time is reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A debugging control system using inside-core events as trigger conditions applied to a core under debug comprising:
    a clock controller for output of a pause clock and a recovery clock to the core under debug within a preset search range of clock cycles for control of the core under debug in a debug mode and a normal mode, respectively; and
    a debug control module having a trigger comparator circuit and at least one shift buffer; data in the core under debug is temporarily saved in the shift buffer and is also used by the trigger comparator circuit to detect whether an internal state of the core under debug satisfies the trigger condition in the debug mode.

2. The system as claimed in claim 1, wherein the core under debug transmits the data to the shift buffer via at least one scan chain.

3. The system as claimed in claim 1, wherein the core under debug furnishes capability of wrapping a core with the boundary scan standard IEEE 1149.1 or IEEE 1500.

4. The system as claimed in claim 1, wherein the trigger condition is a single trigger event or a plurality of trigger events combined according to logical relations, the sequencing order and the number of occurrences while the trigger event is a comparison result of a trigger signal with a trigger value or another trigger signal by a comparison operator.

5. The system as claimed in claim 4, wherein the trigger signal is selected from one of registers of the scan chain of the core under debug.

6. The system as claimed in claim 1, wherein the system further includes a graphical interface software module that is used to set up the trigger condition and the search range of the clock cycle.

7. The system as claimed in claim 6, wherein the graphical interface software module is connected to the debug control module by an interface selected from the group consisting of a joint test action group (JTAG) interface, an universal asynchronous receiver/transmitter (UART) interface, a peripheral component interconnect (PCI) interface and an universal serial bus (USB) interface.

8. The system as claimed in claim 1, wherein the shift buffer includes at least one scan buffer, at least one load buffer, and at least one data counter; in a debug mode, the scan buffer temporarily saves data in the core under debug while the data saved in the scan buffer is replicated by the load buffer in a parallel way; the data counter is for counting data in the scan buffer.

9. The system as claimed in claim 8, wherein the data in the scan buffer is also returned to original position in the core under debug when the data is moved to the trigger comparator circuit.

10. The system as claimed in claim 1, wherein the trigger comparator circuit includes at least one trigger event recorder, at least one event processing unit, and at least one conversion circuit; the trigger event recorder combines the data in the shift buffer to form trigger signal for comparison with the trigger event and compares the trigger signal with the trigger event to learn whether they are matched or not; the trigger event recorder transmits at least one comparison result to the event processing unit for detecting whether the sequencing order and the number of occurrences of the trigger event satisfy the trigger condition; the event processing unit delivers a detection result to the conversion circuit for checking whether the logical relations of the trigger event satisfy the trigger condition.

11. The system as claimed in claim 10, wherein the trigger event recorder includes at least one record buffer for recording the trigger signal and a comparator for checking whether the trigger signal matches the trigger event.

12. The system as claimed in claim 11, wherein the comparator compares the trigger signal with a trigger value that can an unsigned number, a signed number, a floating point number or another trigger signal to get a relation therebetween and outputs a comparison result; the relation therebetween is equal to, not equal to, greater, no less, smaller or no more than each other.

13. The system as claimed in claim 10, wherein the event processing unit includes a trigger sequencer and a trigger event counter; the trigger sequencer having a multiplexer and an AND gate is for detecting the sequencing order of the trigger events while the trigger event counter having a counter and a comparator is used to detect the number of occurrences of a trigger event.

14. The system as claimed in claim 10, wherein the conversion circuit is a look-up table conversion circuit.

15. The system as claimed in claim 1, wherein the debug control module controls debug flows by a finite-state machine (FSM) and generates test mode select (TMS) signals for control of the core under debug.

16. The system as claimed in claim 1, wherein the search range of the clock cycle is a part of the clock cycles while the core under debug performing processing.

17. A debugging control method that uses inside-core events as trigger conditions applied to a core under debug comprising the steps of:
    Step S1: setting up at least one trigger condition and a search range of the clock cycle according to internal states of the core under debug;
    Step S2: pausing clock and recovering clock within each clock cycle of the search range;
    Step S3: retrieving data of scan chains of the core under debug by a shift buffer during the clock pausing;

Step S4: combining the data of the scan chains by a trigger comparator circuit to form trigger signals and checking whether the trigger signals satisfy the trigger condition;

Step S5: pausing the clock continuingly and outputting internal states of the scan chains of the core under if the trigger signal satisfies the trigger condition or the trigger signal is over the search range of clock cycle; if not, recovering operations of the core under debug.

18. The method as claimed in claim 17, wherein the trigger condition is a single trigger event or a plurality of trigger events combined according to logical relations, the sequencing order and the number of occurrences while each trigger event is a comparison result of a trigger signal with a trigger value or another trigger signal by a comparison operator.

19. The method as claimed in claim 17, wherein the trigger signal is selected from one of registers of the scan chain of the core under debug.

20. The method as claimed in claim 17, wherein the search range of the clock cycle is a part of the clock cycle while the core under debug performing processing.

21. The method as claimed in claim 17, wherein in the step S2, a clock controller is used for pausing clock and recovering clock within each clock cycle of the search range.

22. The method as claimed in claim 17, wherein in a debug mode, the shift buffer temporarily saves data in the core under debug by a scan buffer, replicates the data saved in the scan buffer by a load buffer in a parallel way, and counts data in the scan buffer by a data counter.

23. The method as claimed in claim 22, wherein the data in the scan buffer is also returned to original position in the core under debug so that the core under debug can be resumed to execute original programs after turning back to a normal mode.

24. The method as claimed in claim 17, wherein the trigger comparator circuit includes at least one trigger event recorder, at least one event processing unit, and at least one conversion circuit; the trigger event recorder combines the data in the shift buffer to form trigger signals for comparison with the trigger event and compares the trigger signal with the trigger event to learn whether they are matched or not; the trigger event recorder transmits at least one comparison result to the event processing unit for detecting whether the sequencing order and the number of occurrences of the trigger event satisfy the trigger condition; the event processing unit delivers a detection result to the conversion circuit for checking whether the logical relations of the trigger event satisfy the trigger condition.

* * * * *